(12) United States Patent
Jha et al.

(10) Patent No.: US 11,967,524 B2
(45) Date of Patent: Apr. 23, 2024

(54) 3D NAND GATE STACK REINFORCEMENT

(71) Applicant: Applied Materials, Inc., Santa Clara, CA (US)

(72) Inventors: Praket Prakash Jha, San Jose, CA (US); Shuchi Sunil Ojha, Redwood City, CA (US); Jingmei Liang, San Jose, CA (US); Abhijit Basu Mallick, Fremont, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 129 days.

(21) Appl. No.: 17/089,221

(22) Filed: Nov. 4, 2020

(65) Prior Publication Data

US 2021/0143058 A1 May 13, 2021

Related U.S. Application Data

(60) Provisional application No. 62/932,861, filed on Nov. 8, 2019.

(51) Int. Cl.
*H01L 21/768* (2006.01)
*H01L 21/02* (2006.01)
(Continued)

(52) U.S. Cl.
CPC .. *H01L 21/76877* (2013.01); *H01L 21/02164* (2013.01); *H01L 21/0217* (2013.01);
(Continued)

(58) Field of Classification Search
CPC ......... H01L 21/76877; H01L 21/02164; H01L 21/0217; H01L 21/31111; H01L 21/32055;
(Continued)

(56) References Cited

U.S. PATENT DOCUMENTS 9,355,849 B1    5/2016  Levy et al.
9,892,930 B1 *  2/2018  Sawa .................... H01L 23/528
                        (Continued)

FOREIGN PATENT DOCUMENTS

TW    2017-09294 A    3/2017

OTHER PUBLICATIONS

International Search Report and Written Opinion dated Feb. 19, 2021 in International Patent Application No. PCT/US2020/058864, 6 pages.

(Continued)

*Primary Examiner* — Monica D Harrison
*Assistant Examiner* — Andre C Stevenson
(74) *Attorney, Agent, or Firm* — Kilpatrick Townsend & Stockton LLP

(57) ABSTRACT

Exemplary methods of forming a semiconductor structure may include forming a first silicon oxide layer overlying a semiconductor substrate. The methods may include forming a first silicon layer overlying the first silicon oxide layer. The methods may include forming a silicon nitride layer overlying the first silicon layer. The methods may include forming a second silicon layer overlying the silicon nitride layer. The methods may include forming a second silicon oxide layer overlying the second silicon layer. The methods may include removing the silicon nitride layer. The methods may include removing the first silicon layer and the second silicon layer. The methods may include forming a metal layer between and contacting each of the first silicon oxide layer and the second silicon oxide layer.

19 Claims, 9 Drawing Sheets

(51) Int. Cl.
H01L 21/311 (2006.01)
H01L 21/3205 (2006.01)
H01L 21/3213 (2006.01)
H10B 41/27 (2023.01)
H10B 43/27 (2023.01)

(52) U.S. Cl.
CPC .. H01L 21/31111 (2013.01); H01L 21/32055 (2013.01); H01L 21/32135 (2013.01); H01L 21/76802 (2013.01); H10B 41/27 (2023.02); H10B 43/27 (2023.02)

(58) Field of Classification Search
CPC ......... H01L 21/32135; H01L 21/76802; H01L 27/11556; H01L 27/11582; H01L 27/11524; H01L 27/11529; G11C 16/0483
See application file for complete search history.

(56) References Cited

U.S. PATENT DOCUMENTS

| | | | |
|---|---|---|---|
| 2006/0246684 A1* | 11/2006 | Hoshi | H01L 27/115 438/243 |
| 2011/0115014 A1 | 5/2011 | Ichinose et al. | |
| 2016/0043093 A1* | 2/2016 | Lee | H01L 29/1033 257/314 |
| 2016/0049480 A1* | 2/2016 | Chang | H01L 29/7827 257/369 |
| 2016/0079268 A1 | 3/2016 | Sakuma et al. | |
| 2016/0086972 A1 | 3/2016 | Zhang et al. | |
| 2017/0104003 A1 | 4/2017 | Masuda et al. | |
| 2017/0229316 A1 | 8/2017 | Surla et al. | |
| 2018/0040627 A1* | 2/2018 | Kanakamedala | H01L 27/11573 |
| 2019/0115365 A1 | 4/2019 | Han et al. | |
| 2019/0206696 A1 | 7/2019 | Hsu et al. | |
| 2021/0202703 A1* | 7/2021 | Rajashekhar | H10B 51/20 |
| 2022/0051938 A1* | 2/2022 | Wu | H01L 21/02263 |
| 2022/0157847 A1* | 5/2022 | Zhang | H10B 43/27 |

OTHER PUBLICATIONS

Application No. PCT/US2020/058864, International Preliminary Report on Patentability, dated May 19, 2022, 5 pages.

* cited by examiner

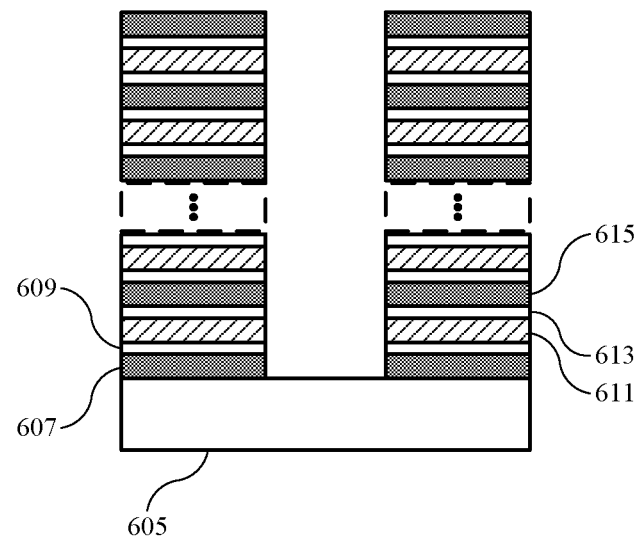
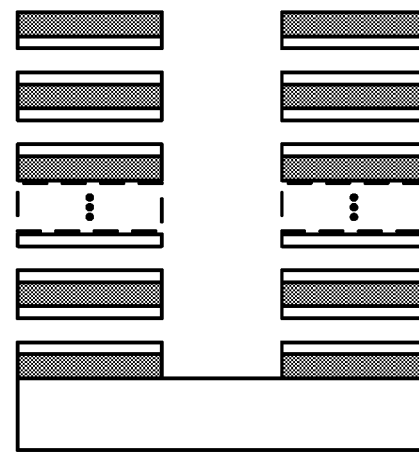
FIG. 6A  FIG. 6B
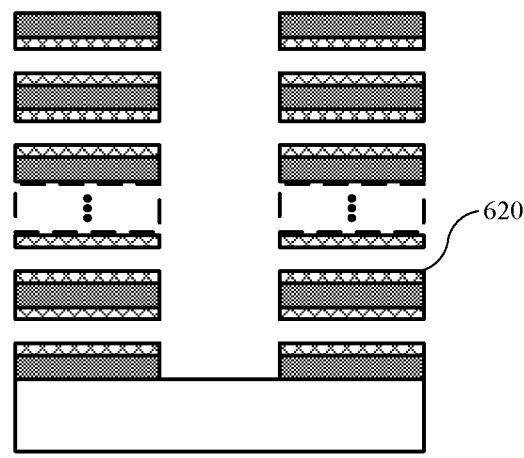
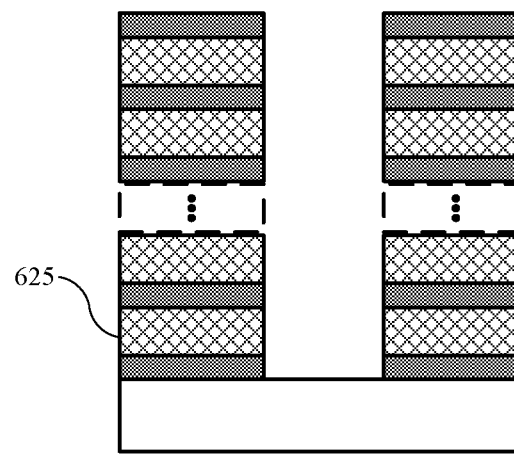
FIG. 6C  FIG. 6D

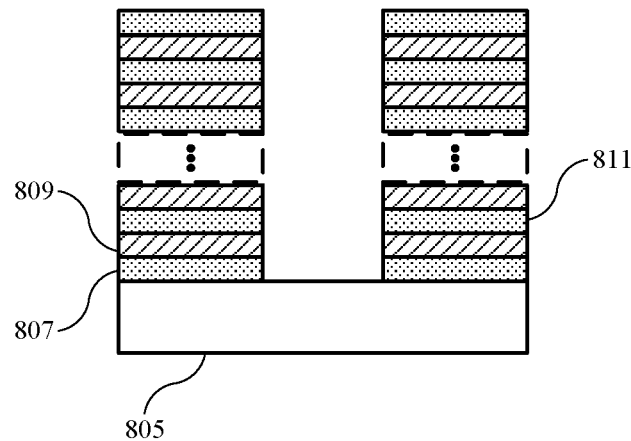
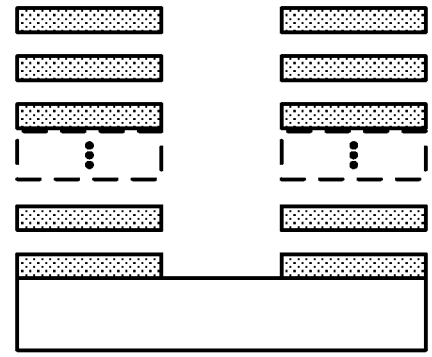
FIG. 8A  FIG. 8B
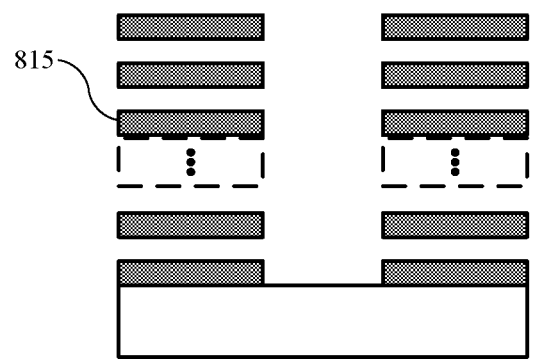
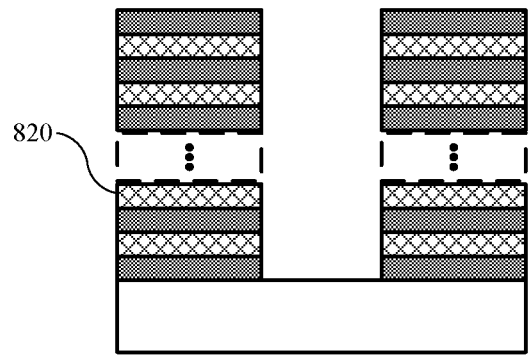
FIG. 8C  FIG. 8D

3D NAND GATE STACK REINFORCEMENT

CROSS REFERENCES TO RELATED APPLICATIONS

This application claims the benefit of priority to U.S. patent application Ser. No. 62/932,861 filed Nov. 8, 2019, the contents of which are hereby incorporated by reference in their entirety for all purposes.

TECHNICAL FIELD

The present technology relates to semiconductor processes and materials. More specifically, the present technology relates to methods of forming reinforced semiconductor structures.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric materials through which a number of memory holes or apertures may be etched. Material properties of the layers, as well as process conditions and materials for etching, may affect the uniformity and integrity of the formed structures. As devices continue to scale, conventional technologies may be incapable of adequate processing.

Thus, there is a need for improved systems and methods that can be used to produce high quality devices and structures. These and other needs are addressed by the present technology.

SUMMARY

Exemplary methods of forming a semiconductor structure may include forming a first silicon oxide layer overlying a semiconductor substrate. The methods may include forming a first silicon layer overlying the first silicon oxide layer. The methods may include forming a silicon nitride layer overlying the first silicon layer. The methods may include forming a second silicon layer overlying the silicon nitride layer. The methods may include forming a second silicon oxide layer overlying the second silicon layer. The methods may include removing the silicon nitride layer. The methods may include removing the first silicon layer and the second silicon layer. The methods may include forming a metal layer between and contacting each of the first silicon oxide layer and the second silicon oxide layer.

In some embodiments, the silicon nitride layer may be removed by a wet etch process. The first silicon layer and the second silicon layer may be removed by a dry etch process. The second silicon layer and the second silicon oxide layer may form a composite film characterized by a Young's modulus of greater than or about 90 GPa. The metal layer may be or include tungsten. The methods may include forming a liner layer along the first silicon oxide layer and the second silicon oxide layer subsequent removing the first silicon layer and the second silicon layer. Forming the first silicon oxide layer may occur in a first processing chamber, and removing the first silicon layer and the second silicon layer may occur in a second processing chamber. The methods may include transferring the semiconductor substrate from the first processing chamber to the second processing chamber while maintaining vacuum conditions. The first silicon oxide layer and the second silicon oxide layer may be characterized by a thickness of less than or about 50 nm.

Some embodiments of the present technology may encompass methods of forming a semiconductor structure. The methods may include forming a first silicon oxide layer overlying a semiconductor substrate. The methods may include forming a first amorphous silicon layer overlying the first silicon oxide layer. The methods may include forming a silicon nitride layer overlying the first amorphous silicon layer. The methods may include forming a second amorphous silicon layer overlying the silicon nitride layer. The methods may include forming a second silicon oxide layer overlying the second amorphous silicon layer. The methods may include removing the silicon nitride layer. The methods may also include converting the first amorphous silicon layer and the second amorphous silicon layer to a metal material respectively in contact with the first silicon oxide layer and the second silicon oxide layer.

In some embodiments, the converting may include flowing a metal-containing precursor to contact the first amorphous silicon layer and the second amorphous silicon layer. The methods may include forming a volatile silicon-containing byproduct while forming a layer of the metal material. The methods may include forming a layer of metal material extending between the first silicon oxide layer and the second silicon oxide layer. The silicon nitride layer may be removed by a wet etch process. The first amorphous silicon layer and the second amorphous silicon layer may be characterized by a thickness of less than or about 5 nm.

Some embodiments of the present technology may encompass methods of forming a semiconductor structure. The methods may include forming a first silicon oxide layer overlying a semiconductor substrate. The first silicon oxide layer may include a nitrogen dopant or a silicon-rich stoichiometry. The methods may include forming a silicon nitride layer overlying the first silicon oxide layer. The methods may include forming a second silicon oxide layer overlying the silicon nitride layer. The second silicon oxide layer may include a nitrogen dopant or a silicon-rich stoichiometry. The methods may include removing the silicon nitride layer. The methods may include treating the first silicon oxide layer and the second silicon oxide layer.

In some embodiments, the treating may include performing a steam anneal. The first silicon oxide layer may include the nitrogen dopant incorporated to a nitrogen concentration below or about 5%. The first silicon oxide layer may be characterized by a Young's modulus of greater than or about 110 GPa. The first silicon oxide layer may be characterized by an oxygen to silicon stoichiometric ratio of less than or about 1.8:1. The first silicon oxide layer may be characterized by a Young's modulus of greater than or about 130 GPa. Subsequent the treating, the first silicon oxide layer and the second silicon oxide layer may be characterized by a breakdown voltage of greater than or about 9 MV/cm.

Such technology may provide numerous benefits over conventional systems and techniques. For example, the processes may produce films characterized by improved resistance to deformation during removal operations. Additionally, the operations of embodiments of the present technology may produce films that are protected from thinning during removal operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIGS. 6A-6D show schematic cross-sectional views of a substrate during formation operations according to some embodiments of the present technology.

FIGS. 8A-8D show schematic cross-sectional views of a substrate during formation operations according to some embodiments of the present technology.

Figure 1:
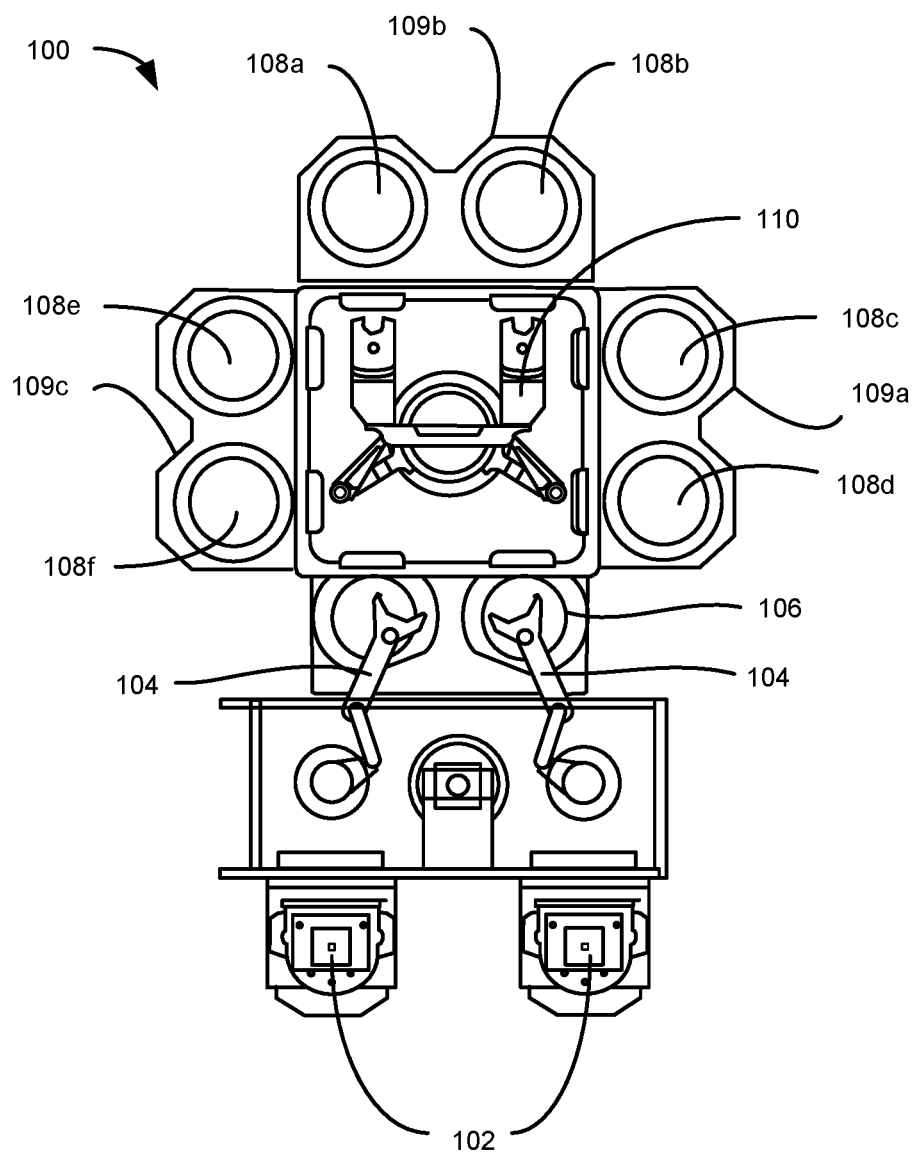
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND, many process operations are modified from vertical to horizontal operations. During 3D NAND processing, stacks of placeholder layers and dielectric materials may form the inter-electrode dielectric or inter-poly dielectric ("IPD") layers. These placeholder layers may have a variety of operations performed to place structures before fully removing the material and replacing it with metal. As memory devices continue to scale, and more cells are developed per stack, the dielectric and placeholder layers continue to reduce in thickness. When the memory holes are formed, apertures may extend through all of the alternating layers of material before accessing the underlying substrate. Subsequent processing may form a staircase structure for contacts, and may also exhume the placeholder materials laterally, and form a conductive material within the recesses.

Many technologies utilize a wet etch to access each of the cell placeholder materials to perform a lateral etch of placeholders. For example, in many oxide-nitride stacks, the nitride may be removed by a wet etch, which may include a hot phosphoric acid treatment that may be selective to nitride over oxide. However, wet etching of small form factor structures may cause pattern collapse or deformation due to surface tension of the etchant, such as with subsequent drying operations. Oxide layers may be characterized by a reduced stiffness or resistance to surface tension effects, which may cause the dielectric materials to deform during the etching process. Depending on the structural aspects and removal required, thinning of the dielectric material layers may also occur during the placeholder removal.

The present technology overcomes these issues by producing structurally reinforced dielectric layers, which may better withstand effects of a wet etching process. Additionally, aspects of the present technology may beneficially enhance metal fill. After describing exemplary systems that may be configured to perform aspects of the present technology, a number of exemplary methods and materials will be described.

Although the remaining disclosure will routinely identify specific deposition and removal processes utilizing the disclosed technology to produce specific structures, such as for memory, it will be readily understood that the systems and methods are equally applicable to a number of other processes and semiconductor structures. Accordingly, the technology should not be considered to be so limited as for use with the noted deposition and etching processes or chambers alone. Moreover, although an exemplary chamber and system is described to provide foundation for the present technology, it is to be understood that the present technology can be applied to virtually any semiconductor processing chamber or system that may allow the processing operations described.

FIG. 1 shows a top plan view of one embodiment of a processing system 100 of deposition, etching, annealing, or other processing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-109c. A second robotic arm 110 may be used to transport the substrate wafers from the holding area 106 to the substrate processing chambers 108a-f and back. Each substrate processing chamber 108a-f, can be outfitted to perform a number of substrate processing operations including deposition processes described herein in addition to dry etching processes, removal processing, atomic layer deposition, chemical vapor deposition, physical vapor deposition, general etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be configured specifically to deposit dielectric material on the substrate as described below, and the third pair of processing chambers, e.g., 108a-b, may be used to etch the deposited dielectric. In another configuration, all three pairs of chambers, e.g., 108a-f, may be configured to deposit a dielectric film on the substrate. Any one or more of the processes described may be carried out in one or more chambers separated from the fabrication system shown in different embodiments. It will be appreciated that additional configurations of deposition, etching, annealing, and curing chambers for dielectric films are contemplated by system 100.

Figure 2A:
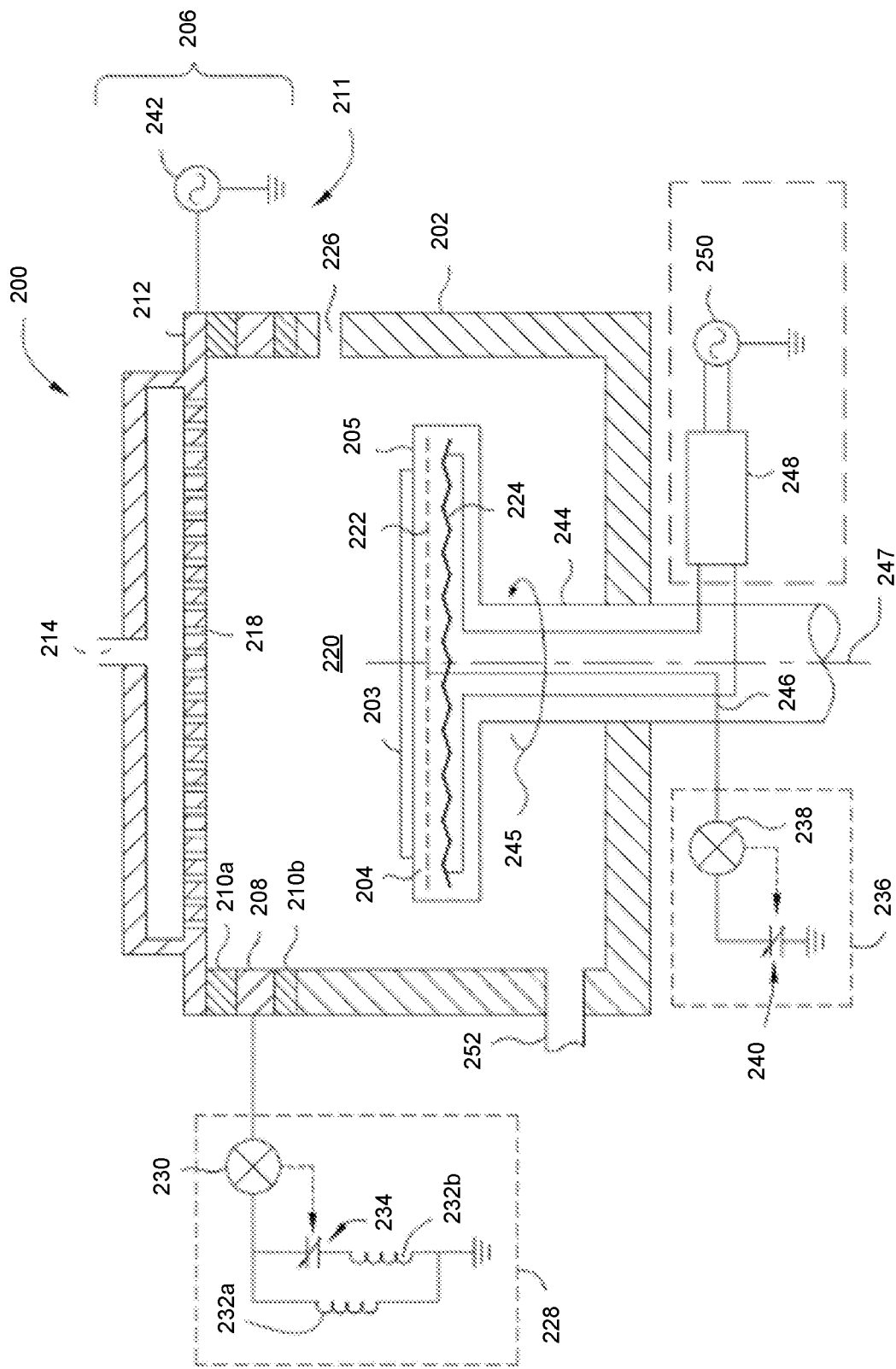
FIG. 2A shows a schematic cross-sectional view of an exemplary processing chamber according to some embodiments of the present technology.

FIG. 2 shows a cross-sectional view of an exemplary processing chamber 200 according to some embodiments of the present technology. The figure may illustrate an overview of a system incorporating one or more aspects of the present technology, and/or which may be specifically configured to perform one or more operations according to embodiments of the present technology. Additional details of chamber 200 or methods performed in the specifically configured chamber may be described further below. Chamber 200 may be utilized to form film layers according to some embodiments of the present technology, although it is to be understood that the methods may similarly be performed in any chamber within which film formation may occur. The processing chamber 200 may include a chamber body 202, a substrate support 204 disposed inside the chamber body 202, and a lid assembly 206 coupled with the chamber body 202 and enclosing the substrate support 204 in a processing volume 220. A substrate 203 may be provided to the processing volume 220 through an opening 226, which may be conventionally sealed for processing using a slit valve or door. The substrate 203 may be seated on a surface 205 of the substrate support during processing. The substrate support 204 may be rotatable, as indicated by the arrow 245, along an axis 247, where a shaft 244 of the substrate support 204 may be located. Alternatively, the substrate support 204 may be lifted up to rotate as necessary during a deposition process.

A plasma profile modulator 211 may be disposed in the processing chamber 200 to control plasma distribution across the substrate 203 disposed on the substrate support 204. The plasma profile modulator 211 may include a first electrode 208 that may be disposed adjacent to the chamber body 202, and may separate the chamber body 202 from other components of the lid assembly 206. The first electrode 208 may be part of the lid assembly 206, or may be a separate sidewall electrode. The first electrode 208 may be an annular or ring-like member, and may be a ring electrode. The first electrode 208 may be a continuous member around a circumference of the processing chamber 200 surrounding the processing volume 220, or may be discontinuous at selected locations if desired. The first electrode 208 may also be a perforated electrode, such as a perforated ring or a mesh electrode, or may be a plate electrode, such as, for example, a secondary gas distributor.

One or more isolators 210a, 210b, which may be a dielectric material such as a ceramic or metal oxide, for example aluminum oxide and/or aluminum nitride, may contact the first electrode 208 and separate the first electrode 208 electrically and thermally from a gas distributor 212 and from the chamber body 202. The gas distributor 212 may define apertures 218 for distributing process precursors into the processing volume 220. The gas distributor 212 may be coupled with a first source of electric power 242, such as an RF generator, RF power source, DC power source, pulsed DC power source, pulsed RF power source, or any other power source that may be coupled with the processing chamber. In some embodiments, the first source of electric power 242 may be an RF power source. In some embodiments the first source of electric power 242 may also be an inductively coupled plasma coil extending about inlet 214, and which may be used to produce or deliver plasma effluents into the processing volume 220.

The gas distributor 212 may be a conductive gas distributor or a non-conductive gas distributor. The gas distributor 212 may also be formed of conductive and non-conductive components. For example, a body of the gas distributor 212 may be conductive while a face plate of the gas distributor 212 may be non-conductive. The gas distributor 212 may be powered, such as by the first source of electric power 242 as shown in FIG. 2, or the gas distributor 212 may be coupled with ground in some embodiments.

The first electrode 208 may be coupled with a first tuning circuit 228 that may control a ground pathway of the processing chamber 200. The first tuning circuit 228 may include a first electronic sensor 230 and a first electronic controller 234. The first electronic controller 234 may be or include a variable capacitor or other circuit elements. The first tuning circuit 228 may be or include one or more inductors 232. The first tuning circuit 228 may be any circuit that enables variable or controllable impedance under the plasma conditions present in the processing volume 220 during processing. In some embodiments as illustrated, the first tuning circuit 228 may include a first circuit leg and a second circuit leg coupled in parallel between ground and the first electronic sensor 230. The first circuit leg may include a first inductor 232a. The second circuit leg may include a second inductor 232b coupled in series with the first electronic controller 234. The second inductor 232b may be disposed between the first electronic controller 234 and a node connecting both the first and second circuit legs to the first electronic sensor 230. The first electronic sensor 230 may be a voltage or current sensor and may be coupled with the first electronic controller 234, which may afford a degree of closed-loop control of plasma conditions inside the processing volume 220.

A second electrode 222 may be coupled with the substrate support 204. The second electrode 222 may be embedded within the substrate support 204 or coupled with a surface of the substrate support 204. The second electrode 222 may be a plate, a perforated plate, a mesh, a wire screen, or any other distributed arrangement of conductive elements. The second electrode 222 may be a tuning electrode, and may be coupled with a second tuning circuit 236 by a conduit 246, for example a cable having a selected resistance, such as 50 ohms, for example, disposed in the shaft 244 of the substrate support 204. The second tuning circuit 236 may have a second electronic sensor 238 and a second electronic controller 240, which may be a second variable capacitor. The second electronic sensor 238 may be a voltage or current sensor, and may be coupled with the second electronic controller 240 to provide further control over plasma conditions in the processing volume 220.

A third electrode 224, which may be a bias electrode and/or an electrostatic chucking electrode, may be coupled with the substrate support 204. The third electrode may be coupled with a second source of electric power 250 through a filter 248, which may be an impedance matching circuit. The second source of electric power 250 may be DC power, pulsed DC power, RF bias power, a pulsed RF source or bias power, or a combination of these or other power sources. In some embodiments, the second source of electric power 250 may be an RF bias power.

The lid assembly 206 and substrate support 204 of FIG. 1 may be used with any processing chamber for plasma or thermal processing. In operation, the processing chamber 200 may afford real-time control of plasma conditions in the processing volume 220. The substrate 203 may be disposed on the substrate support 204, and process gases may be flowed through the lid assembly 206 using inlet 214 according to any desired flow plan. Gases may exit the processing chamber 200 through an outlet 252, which may be coupled with a pump, such as any exhaust pump, including a turbomolecular pump in some embodiments. Electric power may be coupled with the gas distributor 212 to establish a plasma in the processing volume 220. The substrate may be subjected to an electrical bias using the third electrode 224 in some embodiments.

Upon energizing a plasma in the processing volume 220, a potential difference may be established between the plasma and the first electrode 208. A potential difference may also be established between the plasma and the second electrode 222. The electronic controllers 234, 240 may then be used to adjust the flow properties of the ground paths represented by the two tuning circuits 228 and 236. A set point may be delivered to the first tuning circuit 228 and the second tuning circuit 236 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 228, 236 may have a variable impedance that may be adjusted using the respective electronic controllers 234, 240. Where the electronic controllers 234, 240 are variable capacitors, the capacitance range of each of the variable capacitors, and the inductances of the first inductor 232a and the second inductor 232b, may be chosen to provide an impedance range. This range may depend on the frequency and voltage characteristics of the plasma, which may have a minimum in the capacitance range of each variable capacitor. Hence, when the capacitance of the first electronic controller 234 is at a minimum or maximum, impedance of the first tuning circuit 228 may be high, resulting in a plasma shape that has a minimum aerial or lateral coverage over the substrate support. When the capacitance of the first electronic controller 234 approaches a value that minimizes the impedance of the first tuning circuit 228, the aerial coverage of the plasma may grow to a maximum, effectively covering the entire working area of the substrate support 204. As the capacitance of the first electronic controller 234 deviates from the minimum impedance setting, the plasma shape may shrink from the chamber walls and aerial coverage of the substrate support may decline. The second electronic controller 240 may have a similar effect, increasing and decreasing aerial coverage of the plasma over the substrate support as the capacitance of the second electronic controller 240 may be changed.

The electronic sensors 230, 238 may be used to tune the respective circuits 228, 236 in a closed loop. A setpoint for current or voltage, depending on the type of sensor used, may be installed in each sensor, and the sensor may be provided with control software that determines an adjustment to each respective electronic controller 234, 240 to minimize deviation from the setpoint. Consequently, a plasma shape may be selected and dynamically controlled during processing. It is to be understood that, while the foregoing discussion is based on electronic controllers 234, 240, which may be variable capacitors, any electronic component with adjustable characteristic may be used to provide tuning circuits 228 and 236 with adjustable impedance.

Figure 2B:
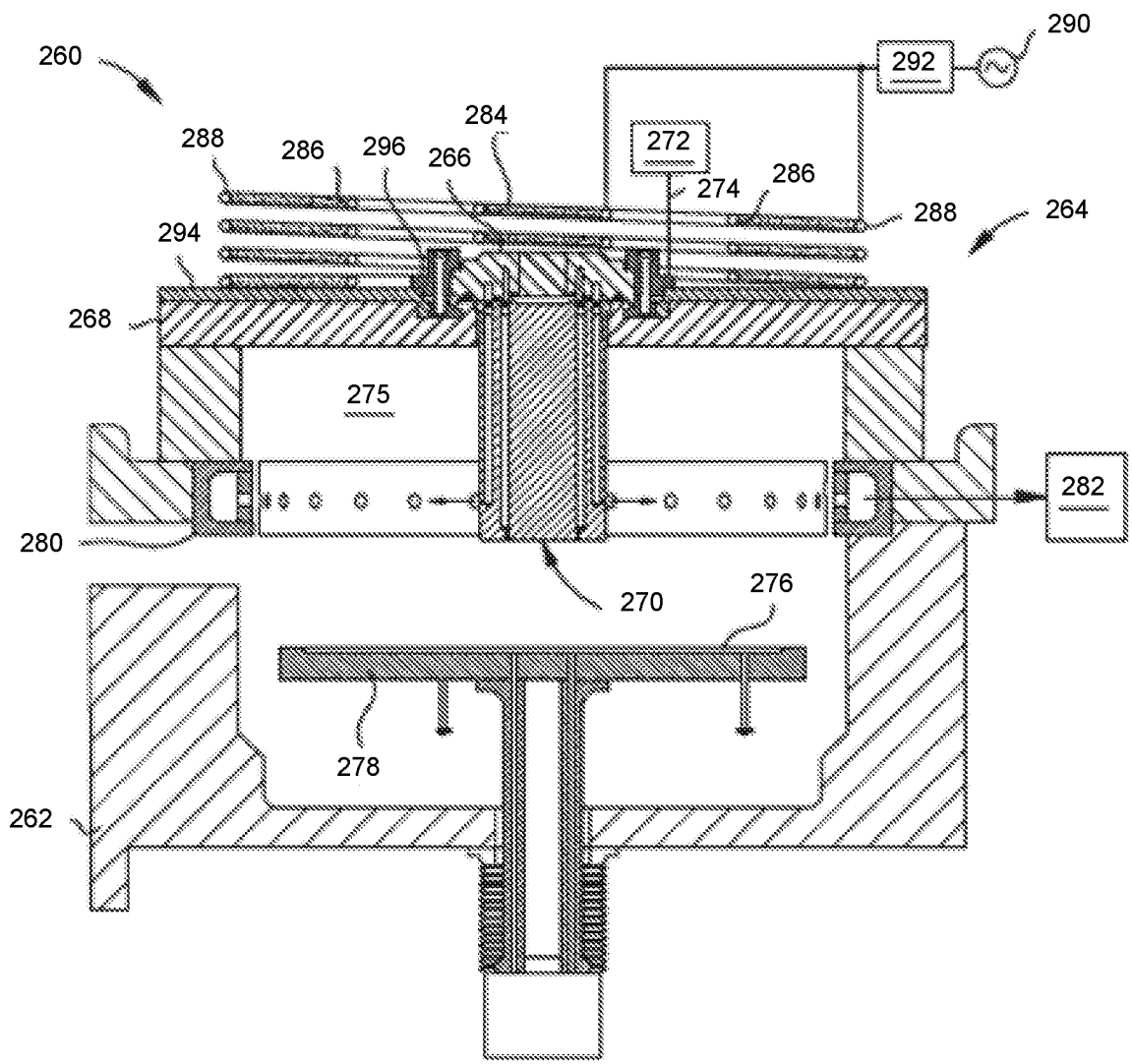
FIG. 2B shows a schematic cross-sectional view of an exemplary processing chamber according to some embodiments of the present technology.

FIG. 2B is a schematic cross-sectional view of a plasma chamber 260 according to some embodiments of the present technology. The figure may illustrate an overview of a system incorporating one or more aspects of the present technology, and/or which may be specifically configured to perform one or more operations according to embodiments of the present technology, such as utilizing an inductively-coupled plasma source. When utilizing a chamber incorporating an inductively-coupled plasma, additional plasma parameters may be controlled, which may affect films produced. For example, the chamber may afford lower processing pressures, which may impact film formation and properties. Plasma chamber 260 may include a chamber body 262 and lid assembly 264, which may be coupled with the chamber body. The lid assembly 264 may include a precursor delivery assembly 266 and a lid 268. The lid 268 may define an aperture or opening 270, which may provide access for one or more processing precursor gases within the processing chamber.

The precursor delivery assembly 266 may be disposed over the lid 268 and extending through the opening 270. The precursor delivery assembly 266 may be coupled with a precursor source 272, and which may provide precursors through an inlet 274 to supply one or more processing precursors into a substrate processing region 275. A substrate 276 may be disposed on a substrate support 278 positioned within or extending into the substrate processing region 275 and coupled with a bias power source or other material or electrical components. The one or more processing precursor gases may exit the substrate processing region 275 via an exhaust ring 280, which may be coupled with an exhaust pump 282. In some embodiments, pump 282 may be a turbo molecular pump, which may allow operational pressures below or about 1 Torr, below or about 500 mTorr, below or about 100 mTorr, below or about 50 mTorr, below or about 20 mTorr, below or about 5 mTorr, or less.

Coupled with the lid assembly 264 may be one or more coils for energizing precursors to produce plasma effluents. The coils may include a number of coil sets, such as inner coils 284, middle coils 286, and outer coils 288, which may all be disposed proximate the lid 268, and may extend about opening 270, for example. The inner coils 284 and the outer coils 288 may be electrically coupled with an RF power source 290 through a matching circuit 292. Power applied to the outer coils 446 from the RF power source 290 may be inductively coupled through the lid 268 to generate plasma from the processing precursors provided from the precursor source 272 within the substrate processing region 275. The RF power source 290 may provide current at a number of different frequencies to control the plasma density, such as a number of ions per unit volume in the plasma, which may define a density of ion flux corresponding to the plasma density over time. The bias power source may control a voltage between the substrate 276 and the plasma produced, and may therefore control an energy and directionality of the ions, such as to draw them towards the substrate. Consequently, plasma chamber 260 may independently control both ion flux and ion energy.

A heater assembly 294 may be positioned adjacent the lid 268, and in some embodiments may be positioned between the lid and the coils as illustrated. The heater assembly 294 may be secured to the lid 408 with clamping members 296. A surface of the substrate may be maintained at a range of temperatures, which may extend between about 100° C. and about 500° C. or more. Plasma chamber 260 may be used in any number of embodiments to produce films as described further below.

Figure 3:
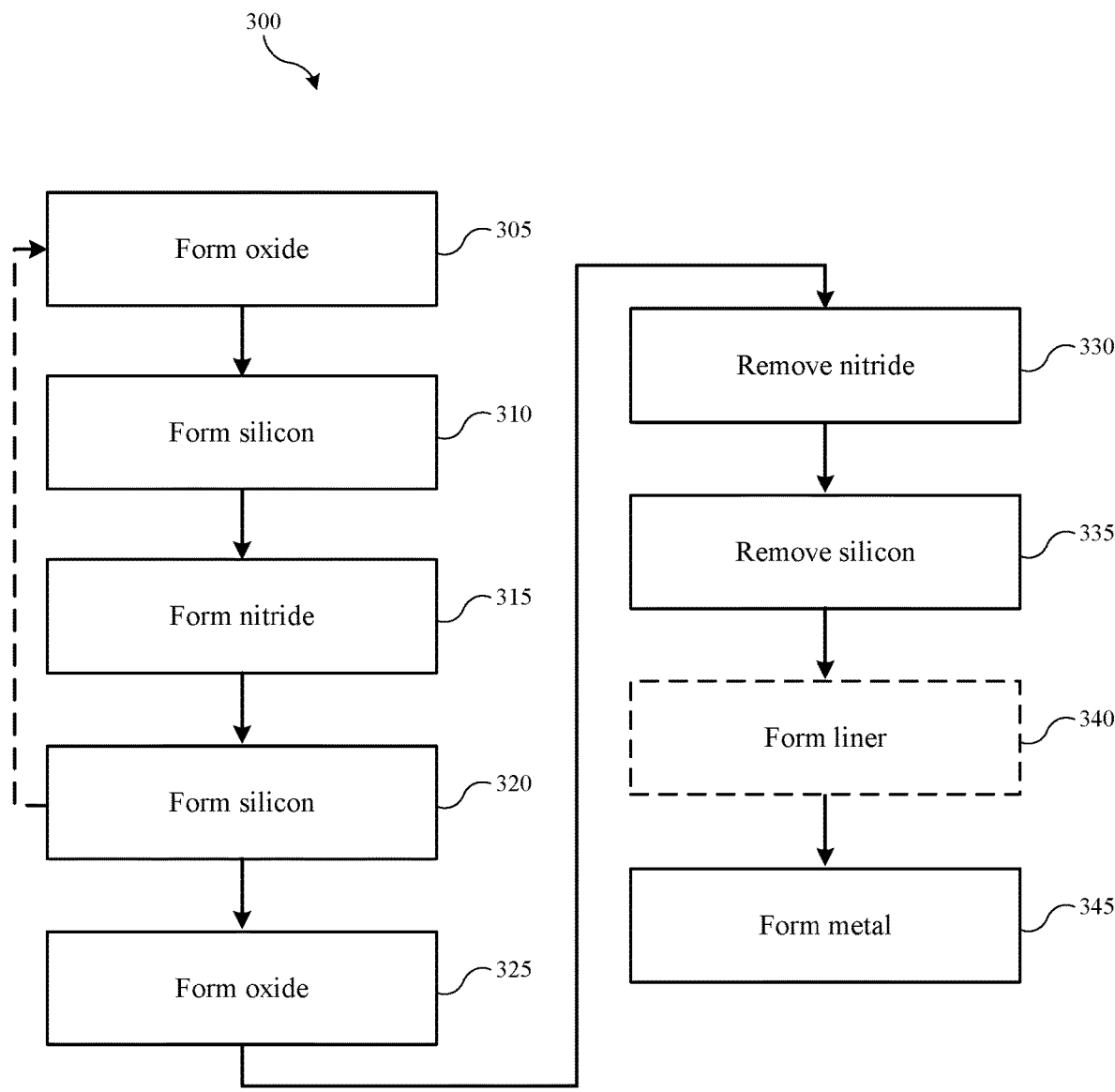
FIG. 3 shows exemplary operations in a method of forming a semiconductor structure according to some embodiments of the present technology.

FIG. 3 shows exemplary operations in a processing method 300 according to some embodiments of the present technology. The method may be performed in a variety of processing chambers, including processing chamber 200 described above, which may be incorporated on system 100, for example. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 300 may describe operations shown schematically in FIGS. 4A-4D, the illustrations of which will be described in conjunction with the operations of method 300. It is to be understood that the figures illustrate only partial schematic views, and a substrate may contain any number of structural sections having aspects as illustrated in the figures, as well as alternative structural aspects that may still benefit from operations of the present technology.

Method 300 may include additional operations prior to initiation of the listed operations. For example, additional processing operations may include forming structures on a semiconductor substrate, which may include both forming and removing material. Prior processing operations may be performed in the chamber in which method 300 may be performed, or processing may be performed in one or more other processing chambers prior to delivering the substrate into the semiconductor processing chamber in which method 300 may be performed. Regardless, method 300 may optionally include delivering a semiconductor substrate to a processing region of a semiconductor processing chamber, such as processing chamber 200 described above, or other chambers that may include components as described above. The substrate may be deposited on a substrate support, which may be a pedestal such as substrate support 204, and which may reside in a processing region of the chamber, such as processing volume 220 described above. An exemplary substrate 405 is illustrated in FIG. 4A, and may be or include aspects of a substrate on which operations according to the present technology may be performed.

The substrate 405 may be any number of materials on which materials may be deposited. The substrate may be or include silicon, germanium, dielectric materials including silicon oxide or silicon nitride, metal materials, or any number of combinations of these materials, which may be the substrate 405, or materials formed on substrate 405. In some embodiments optional treatment operations, such as a pretreatment, may be performed to prepare a surface of substrate 405 for deposition. Additionally, material removal may be performed, such as reduction of native oxides or etching of material, or any other operation that may prepare one or more exposed surfaces of substrate 405 for deposition.

Figure 4A:
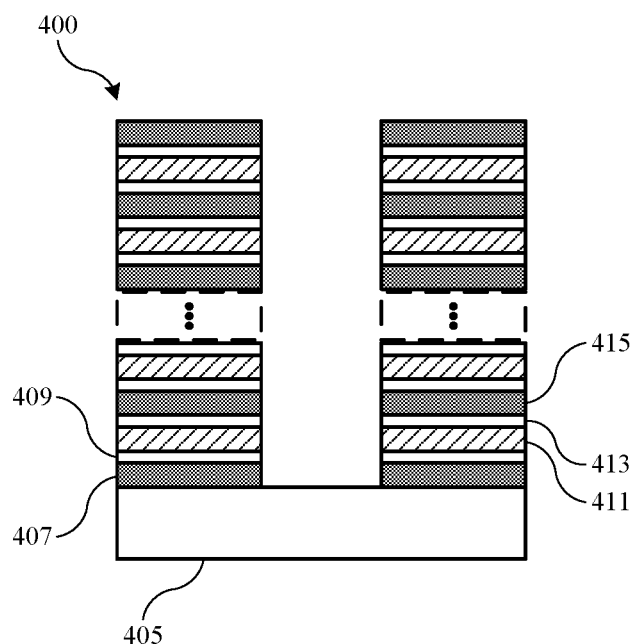
FIGS. 4A-4D show schematic cross-sectional views of a substrate during formation operations according to some embodiments of the present technology.

Method 300 may include forming a first silicon oxide layer overlying the substrate at operation 305, such as illustrated layer 407 in FIG. 4A. The formation may be performed with a silicon-containing precursor and/or an oxygen-containing precursor. While some conventional techniques may include forming a nitride layer overlying the oxide, in some embodiments, a first layer of silicon may be formed overlying the first layer of silicon oxide at operation 310. As illustrated in FIG. 4A, layer 409 may be formed over the oxide layer. The silicon layer may include any number of silicon or silicon-containing materials, and in some embodiments may be or include amorphous silicon. The silicon layer may be formed of a silicon precursor. The method may include forming a silicon nitride layer overlying the silicon layer at operation 315. The formation may be performed with a silicon-containing precursor and a nitrogen-containing precursor. Nitride layer 411 may extend across the silicon layer, and may be separated from the oxide layer by silicon layer 409. Each of the oxide, silicon, and nitride layers may be formed in the same chamber, or in different chambers on the same tool. In some embodiments, each of the layers may be formed in a plasma enhanced chemical vapor deposition process. Between each deposition operation, a purge process may be performed to create discreet transitions between the layers, which may limit surface roughness in layer operations.

A second silicon layer may be formed overlying the silicon nitride layer at operation 320. The second silicon layer may be similar to the first silicon layer in some embodiments, and may be formed with a similar process as the first silicon layer. As shown in FIG. 4A, silicon layer 413 may be similar or identical to silicon layer 409. The two layers may contain the nitride layer 411 between them. A second silicon oxide layer may be formed overlying the second silicon layer in operation 325. As illustrated in the figure, layer 415 may be formed over silicon layer 413. In some embodiments, the second silicon oxide layer may be similar to the first silicon oxide layer, and may be formed by a similar process.

Second silicon oxide layer 415 may be the beginning of a second segment of material formed overlying the substrate. The noted operations may be repeated any number of times until a predetermined number of pairs of layers may be formed that may constitute a stack of layers. For example, any number of layers may be produced within the structure, such as from less than or about 10 layers up to 200 layers of material or more. FIG. 4A illustrates structure 400 encompassed by the present technology including a developed stack of alternating layers, which may maintain the alternating structure described. It is to be understood that any of the layers may be the first layer formed or last layer of the stack in some embodiments of the present technology. Between each layer of silicon oxide and silicon nitride may be an intervening layer of silicon, such as amorphous silicon. The overall stack may include any number of sets of layers including greater than or about 2 sets, greater than or about 10 sets, greater than or about 50 sets, greater than or about 100 sets, or more sets of layers. Accordingly, in some embodiments, operations 305 to 320 may be repeated any number of times to produce a stack of any size. The operations may be halted to end the stack with any of the layers before continuing with further processing. Any specific number of sets encompassed by any of these stated ranges is to be understood as if specifically stated here, and the figure is included merely to illustrate an exemplary structure.

Any number of precursors may be used with the present technology with regard to the deposition precursors used during any of the formation operations. Silicon-containing precursors that may be used during either of the silicon oxide formation, silicon formation, or the silicon nitride formation may include, but are not limited to, silane ($SiH_4$), disilane ($Si_2H_6$), or other organosilanes, silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-containing film formation. Oxygen-containing precursors used in any operation as described throughout the present technology may include $O_2$, $N_2O$, $NO_2$, $O_3$, $H_2O$, as well as any other oxygen-containing precursors that may be used in silicon oxide film formation, or other film formation. Nitrogen-containing precursors used in any operation may include Na, $N_2O$, $NO_2$, $NH_3$, $N_2H_2$, as well as any other nitrogen-containing precursor that may be used in silicon nitride film formation. In any of the formation operations one or more additional precursors may be included, such as inert precursors, which may include Ar, He, Xe, Kr, nitrogen, hydrogen, or other precursors.

The thicknesses of the films may be any range of thicknesses to produce memory or other semiconductor structures. For example, in some embodiments, the layers of oxide or nitride may be less than or about 100 nm, and may be less than or about 90 nm, less than or about 80 nm, less than or about 70 nm, less than or about 60 nm, less than or about 50 nm, less than or about 45 nm, less than or about 40 nm, less than or about 35 nm, less than or about 30 nm, less than or about 25 nm, less than or about 20 nm, less than or about 15 nm, less than or about 10 nm, or less. In some embodiments the oxide or nitride layers may be thinner than the other dielectric or placeholder material layers to accommodate the layers of silicon, while maintaining an overall stack thickness. In some embodiments the silicon may increase the overall thickness of the stack. In some embodiments an oxide thickness sufficient to limit crosstalk or leakage between developed cells may be maintained, and nitride layers may be of reduced thickness to accommodate the incorporated layers of silicon. The layers of silicon may be characterized by a thickness less than the layers of oxide or nitride, and may be characterized by a thickness of less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less.

Temperature and pressure during any operation, either formation or removal, may be controlled depending on the operation being performed. Generally, a pressure within the processing chamber may be less than or about 30 Torr, and may be less than or about 20 Torr, less than or about 15 Torr, less than or about 12 Torr, less than or about 10 Torr, less than or about 8 Torr, less than or about 6 Torr, less than or about 5 Torr, less than or about 4 Torr, less than or about 3 Torr, less than or about 2 Torr, less than or about 1 Torr, or less. For some embodiments, such as with processing chambers including an inductively-coupled plasma source, and or a turbomolecular pump, processing pressures may be further reduced to less than or about 100 mTorr, less than or about 90 mTorr, less than or about 80 mTorr, less than or about 70 mTorr, less than or about 60 mTorr, less than or about 50 mTorr, less than or about 40 mTorr, less than or about 30 mTorr, less than or about 20 mTorr, less than or about 10 mTorr, less than or about 5 mTorr, less than or about 2 mTorr, or less.

Any of the formation or removal operations may be performed at one or more process temperatures, which may be above or about 200° C., and may be greater than or about 250° C., greater than or about 300° C., greater than or about 350° C., greater than or about 400° C., greater than or about 450° C., greater than or about 500° C., or higher. A variety of plasma powers, precursor flow rates, and other chamber conditions may similarly be modified during any of the formation operations or other processing operations. After the stack of materials has been prepared, additional processing operations may be performed. For example, an annealing operation may be performed in some embodiments, such as at temperatures greater than or about 700° C., and which may be greater than or about 750° C., greater than or about 800° C., greater than or about 850° C., greater than or about 900° C., or greater. The anneal may be performed with a heated precursor, such as an inert precursor including nitrogen, for example. A reactive-ion etch process may be performed to produce one or more apertures, such as memory holes, through the stacks of layers. Additionally, a staircase structure may be formed at outer regions of the stack, as well as additional processing to produce aspects of the memory or other semiconductor structure. To begin production of memory cells, the placeholder materials, such as the silicon nitride layers, may be removed from the structure.

Figure 4B:
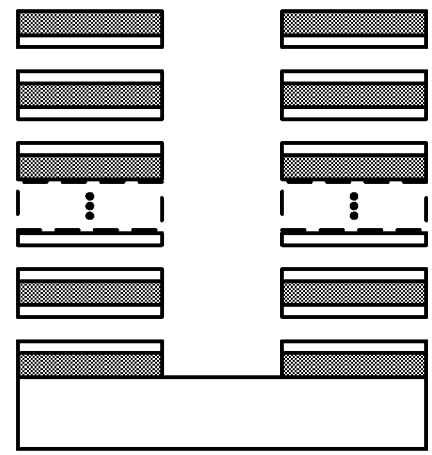

At operation 330, the silicon nitride layer or layers may be removed from the stack of layers, as shown in FIG. 4B. A number of removal operations may be performed, and in some embodiments a wet etch process, such as using hot phosphoric acid, may be performed to remove the nitride film. After the etching has been performed, the wet etchant is often dried from the structure. Surface tension of the etchant may impact the oxide layers. Conventionally formed cells having alternating oxide and nitride layers may cause deformation of the oxide, which may be characterized by reduced thickness and/or stiffness. For example, the Young's modulus of silicon oxide may be below or about 85 GPa, and may be lower than or about 80 GPa, which may increase the likelihood of deformation during etchant dry out processes. Although the Young's modulus of silicon oxide may be increased slightly with tuned deposition, the Young's modulus may still plateau below about 90 GPa, or about 88 GPa. Consequently, the surface tension produced by the wet etchant may overcome the film strength and cause film distortion.

Some embodiments of the present technology incorporating silicon layers between the nitride and oxide layers may form a reinforcement of the oxide, which may facilitate resisting the surface tension associated with drying etchant material. For example, the silicon, such as amorphous silicon, may be characterized by a higher Young's modulus. When incorporated with the layers of oxide, the silicon layer or layers adjacent a layer of silicon oxide may produce a composite material with the oxide that may be characterized by a Young's modulus of greater than or about 90 GPa, and may be characterized by a Young's modulus of greater than or about 92 GPa, greater than or about 94 GPa, greater than or about 96 GPa, greater than or about 98 GPa, greater than or about 100 GPa, greater than or about 102 GPa, or higher. Similarly, the amorphous silicon layers may also improve film hardness. Whereas silicon oxide may be characterized by a hardness of less than 12 GPa, and may be characterized by a hardness of less than or about 11.7 GPa, less than or about 11.6 GPa, or less, incorporating the layers of silicon may improve the hardness to above or about 12.0 GPa, and may improve the hardness of the composite layers to greater than or about 12.2, greater than or about 12.4, greater than or about 12.5, greater than or about 12.6, greater than or about 12.7, greater than or about 12.8, greater than or about 12.9, greater than or about 13.0, or greater. Consequently, the composite film may withstand the drying etchant material surface tension effects.

Additionally, amorphous silicon may be more resistant to wet etching, and nitride removal may be characterized by higher selectivity to the silicon than to oxide. For example, the wet etchant may extend through larger regions of a structure, which may maintain contact with edge regions of oxide layers for extended periods, and which may cause thinning of the oxide layers in some regions. Amorphous silicon layers may protect across the regions of the oxide, and may extend fully across the structure formed. The amorphous silicon may cover edge regions of the oxide layers, which may limit extended interaction with the wet etchant. Hence, the oxide layers may be further protected from thinning by the wet etchant.

Figure 4C:
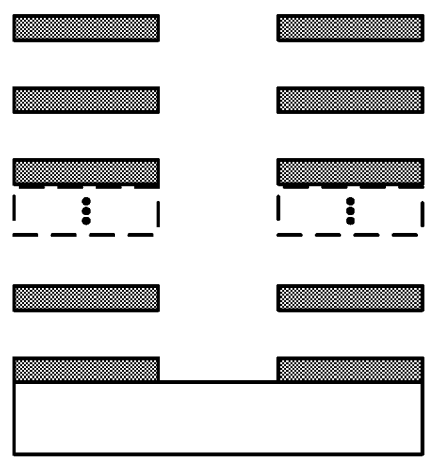

Subsequent removal of the silicon nitride, in some embodiments the layers of silicon may be removed. Although metal fill may occur within the opened accesses, the reduced volume from the silicon layers may increase line resistance of the metal. Accordingly, a second removal process may be performed to remove the first and second layers of silicon selectively from the remaining oxide layers at operation 335, and as illustrated in FIG. 4C. Selectively removing silicon relative to silicon oxide may be performed in a variety of processes, and in some embodiments may involve a dry etch process, including a plasma-enhanced dry etch process.

In some embodiments a substrate may be transferred from a first processing chamber or processing system to a second processing chamber on the same system, or to a separate system on which the dry etch chamber may be disposed. In some embodiments, the dry etch chamber and the deposition chamber may be on the same chamber system, which may allow transferring the substrate from the first processing system to a second processing chamber while maintaining vacuum conditions. In some embodiments the wet etch process may occur on a similar or different processing system, which may include transferring the substrate between chambers and/or systems during operation of the methods.

When delivered into a dry etch processing chamber, the substrate may have nitride layers removed, while including exposed regions or layers of silicon, such as amorphous silicon, as well as layers of oxide, which may be disposed at least partially between the regions or layers of silicon. The silicon removal operation may be performed with one or more precursors including a fluorine-containing precursor, and may also include a hydrogen-containing precursor, as well as one or more additional precursors, which may include an inert or noble gas, such as helium, argon, or other materials which may facilitate the etch process. In some embodiments, one or both of the fluorine-containing precursor or the hydrogen-containing precursor may be flowed into a remote plasma region of the dry etch processing chamber. For example, the remote plasma region may be fluidly coupled with a processing region housing the substrate, although the region may be physically separated, such as by a showerhead, which may operate as an electrode within the remote plasma region. A remote plasma system may also be coupled with the chamber externally and provide plasma effluents into the chamber.

Plasma effluents of the precursors may be delivered into the processing region to contact the layers of silicon and selectively remove them from the oxide layers. Processing conditions may be configured in one or more ways to provide a selective etch of silicon relative to oxide, which may be characterized by a selectivity of greater than or about 100:1. For example, the processing chamber, pedestal, or substrate may be maintained at a temperature of between about 40° C. and about 150° C. during the etching or removal operation, and a pressure within the processing chamber may be maintained below or about 12 Torr, for example. Additionally, in some embodiments flow rates of the fluorine-containing precursor and/or the hydrogen-containing precursor may be modulated, such as to maintain a flow rate ratio between the precursors.

For example, in some embodiments, the removal may be performed while maintaining an atomic flow-rate ratio of hydrogen to fluorine of greater than or about 10:1. Such a process may maintain hydrogen terminated surfaces, which may allow fluorine to remove silicon selectively over oxide. Exemplary hydrogen-containing precursors may include one or more precursors including hydrogen, such as diatomic hydrogen, ammonia, hydrocarbons, or other precursors including hydrogen. Exemplary fluorine-containing precursors may include one or more precursors including atomic fluorine, diatomic fluorine, bromine trifluoride, chlorine trifluoride, nitrogen trifluoride, hydrogen fluoride, fluorinated hydrocarbons, sulfur hexafluoride, or xenon difluoride, as non-limiting examples. Subsequent removal of the silicon layers, further processing may be conducted, including metallization.

In some embodiments additional operations may be performed to improve nucleation and formation of metal within the trenches outlined by the oxide materials. For example, in some embodiments a liner or other material may be formed along exposed surfaces of the oxide in optional operation 340, and illustrated as material 420 in FIG. 4D. The liner material may include a number of barrier or liner materials including metal nitrides, such as titanium nitride, for example, which may include any number of transition metals or other materials. The liner material may be formed conformally along the oxide layers, and may protect oxide surfaces from diffusion or exposure to effluents of a metal-containing precursor, which may include halogen materials, or other materials which may react with oxides.

Figure 4D:
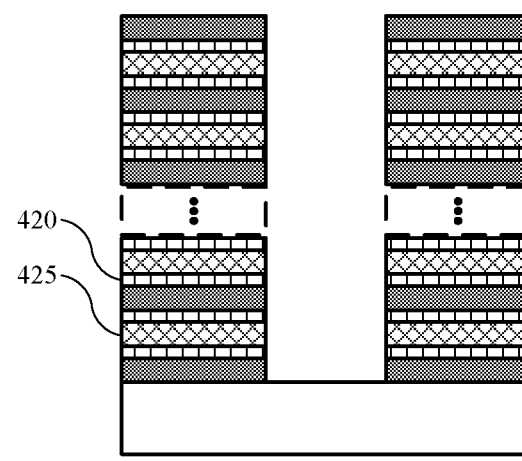

At operation 345, a metal layer may be formed between the layers of oxide and/or liner material if incorporated, as illustrated as material 425 in FIG. 4D. One or more metal-containing or deposition precursors may be used to deposit metal material within the open trench region to form a conductive cell material between the layers of oxide materials. For example, tungsten, cobalt, or other conductive metals or materials may be used as a metal for the cell formation in embodiments of the present technology.

As noted above, a liner material may be incorporated within the trenches to facilitate nucleation of metal material, such as tungsten in one non-limiting embodiment. Tungsten and other metal materials may not readily deposit on silicon oxide, and thus an additional layer of material may often be included to facilitate deposition. Additionally, because the oxide material may operate to separate cells, such as in a memory application, limiting diffusion of metal or removal from metal deposition byproducts may limit crosstalk, and prevent shorting or device malfunction. However, incorporating a liner material, even at a thickness of a few nanometers or less, may further limit a volume that may be occupied by metal. As stack dimensions continue to shrink, the thinner amounts of metal may increase resistance of the material dramatically.

Figure 5:
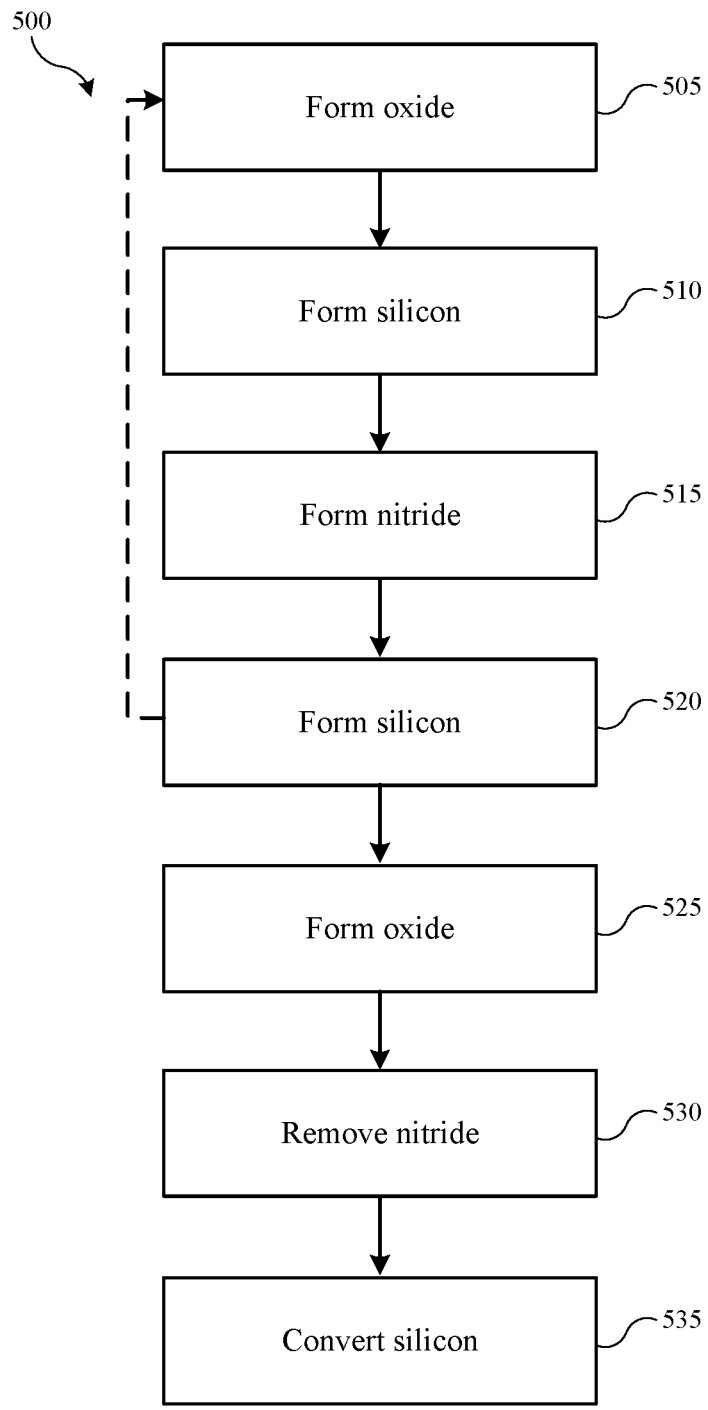
FIG. 5 shows exemplary operations in a method of forming a semiconductor structure according to some embodiments of the present technology.

As described previously, silicon layers may improve oxide resistance to deformation or collapse during wet etch removal of silicon nitride layers. In some embodiments of the present technology, the formed silicon layers may also be utilized to facilitate formation of tungsten or other metals. Turning to FIG. 5 is shown exemplary operations in a method 500 of forming a semiconductor structure according to some embodiments of the present technology. The method may include forming a stack structure and converting aspects of the structure for metal incorporation. Method 500 may include any number of similar operations described above for method 300, and may include any operation, material, or characteristic of any aspect described previously. Additionally, the method may be performed in a variety of processing chambers, including processing chamber 200 described above, which may be incorporated on system 100, for example. Method 500 may describe operations shown schematically in FIGS. 6A-6D, the illustrations of which will be described in conjunction with the operations of method 500. It is to be understood that the figures illustrate only partial schematic views, and a substrate may contain any number of structural sections having aspects as illustrated in the figures, as well as alternative structural aspects that may still benefit from operations of embodiments of the present technology.

Similar to described above for method 300, method 500 may include forming a first oxide layer over a substrate at operation 505. A first amorphous silicon layer may be formed overlying the silicon oxide layer at operation 510. A silicon nitride layer may be formed overlying the amorphous silicon layer at operation 515. A second amorphous silicon layer may be formed overlying the silicon nitride layer at operation 520. A second silicon oxide layer may be formed overlying the second amorphous silicon layer at operation 525. Any of these operations may be performed with any of the precursors described above, with any of the processing conditions or considerations described above, and may include any aspect or characteristic of any previously discussed process, material, or characteristic.

The stack may be extended with any number of layers as described previously, and may include any number of constituent layers of materials. For example, the noted operations may be repeated any number of times until a predetermined number of pairs of layers may be formed that may constitute a stack of layers. For example, any number of layers may be produced within the structure, such as from less than or about 10 layers up to 200 layers of material or more The stack may begin or end with any layer of the layers described, and only one encompassed configuration is shown in FIG. 6A, with silicon layer 609 and silicon layer 613 encompassing nitride layer 611, and with all three layers between oxide layers 607 and 615, and formed overlying substrate 605. As described previously, additional operations may be performed optionally, such as memory hole formation or other stack formation aspects. As illustrated in FIG. 6B, subsequent formation of the stack and any additional optional operations, silicon nitride layers may be removed at operation 530. As described previously, the removal may be performed with a wet etchant, although additional techniques may similarly be encompassed by the present technology.

Method 300 described above encompassed embodiments in which the silicon layers were subsequently removed, such as with a dry etch process. The present technology also encompasses processes in which the silicon layers may alternatively be utilized in a conversion reaction. For example, at operation 535, silicon layers may be converted into metal-containing layers 620 as illustrated in FIG. 6C. Some metal materials may be used to perform a conversion reaction of the amorphous silicon, which may provide an exchange of silicon for the metal material. By performing an exchange reaction, metal material may be formed along the silicon oxide surface, while maintaining a relatively discreet transition between the layers. This may allow the metal formation without additional formation of a liner and/or nucleation layer as discussed above. By removing a liner layer formation, a greater thickness and overall volume of metal material may be produced between the layers of oxide, which may improve resistance through the metal.

The conversion reaction may include flowing a metal-containing precursor into the processing region to contact the amorphous silicon layers, and causing a reaction between the materials. The reaction may at least partially be based on a thermally activated reaction, and the converting may be performed at a temperature of greater than or about 300° C., and may be performed at a temperature of greater than or about 350° C., greater than or about 400° C., greater than or about 450° C., greater than or about 500° C., greater than or about 550° C., greater than or about 600° C., greater than or about 650° C., greater than or about 700° C., greater than or about 750° C., or higher. For example, an exchange of tungsten with silicon may occur along the following reaction:

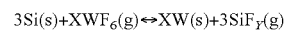

where X may be 1 or 2, for example, and Y may be 2 or 4, for example, among other integers or decimals.

Consequently, the reaction may form a volatile silicon byproduct while leaving solid metal behind to form a layer of the metal material. Because an exchange reaction may be performed, a thickness of the silicon layer may affect the material. For example, if the silicon layer extends beyond a certain threshold, a full conversion may not occur, and residual silicon may be trapped between the oxide layers and a formed layer of metal. Consequently, in some embodiments the layers of silicon may be maintained at a thickness of less than or about 5 nm, and may be maintained at less than or about 4 nm, less than or about 3 nm, less than or about 2 nm, or less.

By performing a conversion reaction, formation at edge regions may be maintained while metal-containing precursor extends within the trench. Accordingly, pinch off and void formation may be reduced in some embodiments. Subsequent the conversion of the silicon material to metal, additional processing may be performed to complete layers of metal-containing material. As illustrated in FIG. 6D, metal material 625 may be extended to connect the converted portions of metal material to produce a substantially or fully continuous layer of metal material extending between oxide layers. Hence, in some embodiments, volume of metal material may be increased in structures where a nucleation and/or barrier layer may not be incorporated along the silicon oxide materials.

Figure 7:
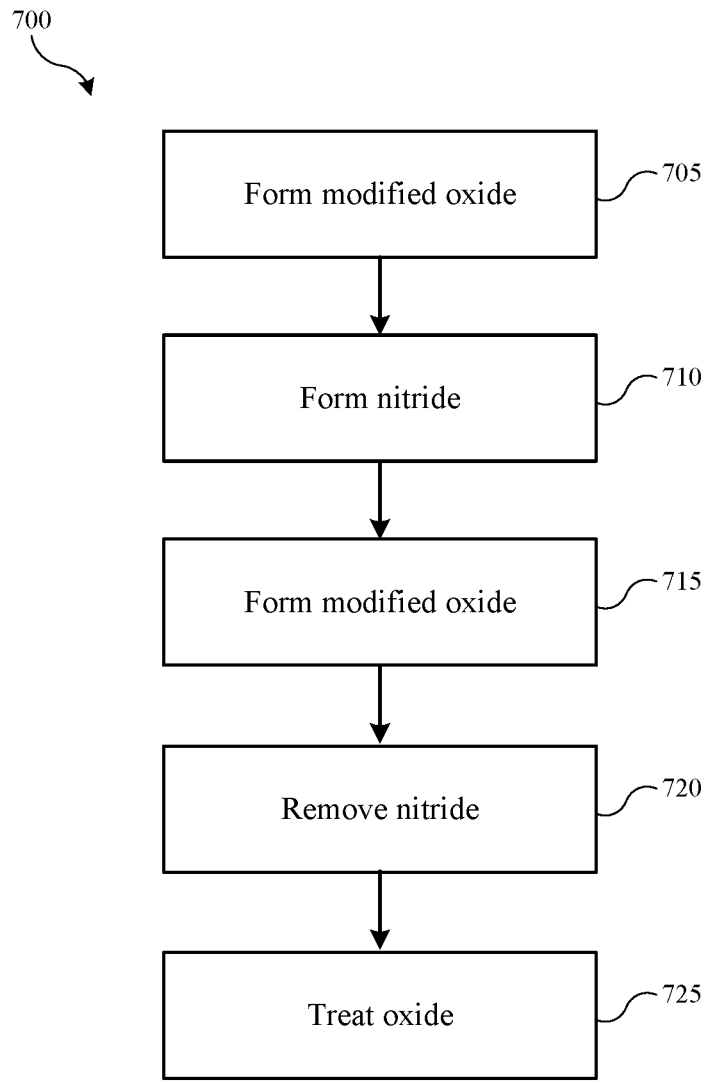
FIG. 7 shows exemplary operations in a method of forming a semiconductor structure according to some embodiments of the present technology.

Embodiments of the present technology may also encompass additional adjustments to reinforce layers of oxide to limit or prevent deformation or collapse during wet process removal of silicon nitride materials. In some embodiments of the present technology, the formed silicon oxide layers may be adjusted with doping to enhance resistance to deformation due to surface tension effects. Turning to FIG. 7 is shown exemplary operations in a method 700 of forming a semiconductor structure according to some embodiments of the present technology. The method may include forming a stack structure utilizing modified silicon oxide materials as dielectric layers. Method 700 may include any number of similar operations described above for method 300 or method 500, and may include any operation, material, or characteristic of any aspect described previously. Additionally, the method may be performed in a variety of processing chambers, including processing chamber 200 described above, which may be incorporated on system 100, for example. Method 700 may describe operations shown schematically in FIGS. 8A-8D, the illustrations of which will be described in conjunction with the operations of method 700. It is to be understood that the figures illustrate only partial schematic views, and a substrate may contain any number of structural sections having aspects as illustrated in the figures, as well as alternative structural aspects that may still benefit from operations of embodiments of the present technology.

In some embodiments, method 700 may include forming a modified oxide layer overlying a substrate at operation 705, and as illustrated as layer 807 overlying substrate 805 in FIG. 8A. The modified layer may include one or more dopants or stoichiometric adjustments. A silicon nitride layer may be formed overlying the amorphous silicon layer at operation 710, and which may be illustrated as layers 809 in FIG. 8A. A second modified silicon oxide layer may be formed overlying the silicon nitride layer at operation 715, and which may be illustrated as layer 811 of FIG. 8A. The second modified layer may also include one or more dopants or stoichiometric adjustments, and may be similar or different from the first silicon oxide layer in embodiments of the present technology. Additional processing may be performed including memory hole or staircase formation, for example, in some embodiments of the technology. At operation 720, layers of silicon nitride may be removed, such as illustrated in FIG. 8B, which again may be performed by any removal techniques, including a wet etch removal as discussed above.

The modified silicon oxide layers may be modified to enhance resistance to deformation from wet etch effects, which may be caused by surface tension of the etchant used in the nitride removal. In some embodiments one or more dopants may be incorporated to increase a Young's modulus of the silicon oxide, and which may also increase the hardness of the material. For example, in some embodiments a nitrogen dopant may be incorporated within the film during formation to provide an amount of nitrogen incorporated within the oxide film. During the layer formation, a nitrogen or nitrogen-containing precursor may be flowed with the silicon-containing precursor and/or oxygen-containing precursor. The nitrogen-containing precursor may include any of the previously noted nitrogen-containing precursors, as well as any combination of precursors noted above.

The nitrogen incorporation may be performed to increase the film properties to enhance structural integrity, and by incorporating the nitrogen doping, a Young's modulus of the modified oxide may be increased to greater than or about 90 GPa, and may be increased to greater than or about 95 GPa, greater than or about 100 GPa, greater than or about 105 GPa, greater than or about 110 GPa, greater than or about 115 GPa, greater than or about 120 GPa, greater than or about 125 GPa, or higher. Additionally, the film hardness may increase to greater than or about 12 GPa, and may increase to greater than or about 13 GPa, greater than or about 14 GPa, greater than or about 15 GPa, greater than or about 16 GPa, greater than or about 17 GPa, or higher.

Because the nitride removal may operate selective to oxide materials, increasing nitrogen doping within the oxide film may increase an etch characteristic of the oxide materials. Accordingly, in some embodiments, to maintain selectivity during the nitride removal, the nitrogen incorporation may be maintained at less than or about 10 at. %, and may be maintained at less than or about 8 at. %, at less than or about 7 at. %, at less than or about 6 at. %, at less than or about 5 at. %, at less than or about 4.5 at. %, at less than or about 4.0 at. %, at less than or about 3.5 at. %, at less than or about 3 at. %, at less than or about 2.5 at. %, at less than or about 2 at. %, at less than or about 1.5 at. %, at less than or about 1 at. %, at less than or about 0.5 at. %, or less. To ensure the increase in structural integrity, the nitrogen incorporation may be maintained at greater than or about 0.5 at. % or more.

Additionally, in some embodiments a stoichiometry of the silicon oxide film may be adjusted to increase the film properties. By increasing the silicon-like properties of the film, structural integrity may be increased relative to a silicon oxide film. To increase the stoichiometric ratio of the formed films, in some embodiments precursor delivery may be modified from standard silicon oxide deposition conditions. For example, during some processing, the silicon-to-oxide atomic ratio may be up to 1:7 in some embodiments. During formation methods according to some embodiments of the present technology, the silicon-to-oxide ratio may be adjusted to less than or about 1:7, and may be adjusted to less than or about 1:6, less than or about 1:5, less than or about 1:4, less than or about 1:3, less than or about 1:2, less than or about 1:1, or less. By providing a relatively oxygen-starved formation process compared to other formations, the oxygen-to-silicon ratio within the produced film may be less than or about 2.0:1, and may be less than or about 1.9:1, less than or about 1.8:1, less than or about 1.7:1, less than or about 1.6:1, less than or about 1.5:1, or less.

By increasing the silicon incorporation within the film, a Young's modulus of the modified oxide may be increased to greater than or about 100 GPa, and may be increased to greater than or about 110 GPa, greater than or about 120 GPa, greater than or about 125 GPa, greater than or about 130 GPa, greater than or about 135 GPa, greater than or about 140 GPa, greater than or about 145 GPa, greater than or about 150 GPa, greater than or about 155 GPa, greater than or about 160 GPa, or higher. Additionally, the film hardness may increase to greater than or about 12 GPa, and may increase to greater than or about 13 GPa, greater than or about 14 GPa, greater than or about 15 GPa, greater than or about 16 GPa, greater than or about 17 GPa, or higher. Any of the previously described additional processing may also be incorporated in optional operations of one or more aspects of method 700, including a nitrogen or other high temperature anneal subsequent film formation.

The dielectric material of the stack may separate cells, such as memory cells, produced by later processing. Nitrogen doping, silicon-rich films, or other doping or modifications may affect the leakage of the produced film, which may impact device performance. Accordingly, in some embodiments method 700 may include treating the modified oxide material at operation 725 after etching or removal of the nitride layers. The treatment may involve removing dopant concentration or adjusting the film properties to be more silicon-oxide like in embodiments, and which is shown as silicon oxide layers 815 in FIG. 8C. For example, treating the modified oxide may include performing an oxygen treatment, which may include in some encompassed embodiments a steam anneal or other oxygen treatment. The anneal may be performed to extract nitrogen or other dopants, and/or increase an oxygen incorporation within the film, and which may be performed at any temperature described previously, including at temperatures above or about 500° C., or higher temperatures previously noted. Additional operations may optionally be performed to form a metal layer 820 as illustrated in FIG. 8D, and which may include any of the materials, including an optional liner as previously described.

Subsequent steam annealing, testing has shown that nitrogen incorporation may be reduced to nominal levels, such as may be included in standard oxide films. Additionally, the stoichiometric ratio of the treated film may be characterized by an oxygen-to-silicon ratio of substantially or essentially 2:1. Leakage current density within the treated film may be maintained at less than or about $1 \times 10^{-6}$ A/cm$^2$, and may be maintained at less than or about $8 \times 10^{-7}$ A/cm$^2$, less than or about $5 \times 10^{-7}$ A/cm$^2$, less than or about $2 \times 10^{-7}$ A/cm$^2$, less than or about $1 \times 10^{-7}$ A/cm$^2$, less than or about $9 \times 10^{-8}$ A/cm$^2$, less than or about $8 \times 10^{-8}$ A/cm$^2$, less than or about $7 \times 10^{-8}$ A/cm$^2$, less than or about $6 \times 10^{-8}$ A/cm$^2$, less than or about $5\times10^{-8}$ A/cm$^2$, less than or about $4\times10^{-8}$ A/cm$^2$, less than or about $3\times10^{-8}$ A/cm$^2$, less than or about $2\times10^{-8}$ A/cm$^2$, less than or about $1.5\times10^{-8}$ A/cm$^2$, less than or about $1.2\times10^{-8}$ A/cm$^2$, less than or about $1\times10^{-8}$ A/cm$^2$, or less.

Additionally, the treated oxide layers may be characterized by a breakdown voltage greater than or about 6.0 MV/cm, and may be characterized by a breakdown voltage greater than or about 7.0 MV/cm, greater than or about 7.5 MV/cm, greater than or about 8.0 MV/cm, greater than or about 8.5 MV/cm, greater than or about 9.0 MV/cm, greater than or about 9.5 MV/cm, greater than or about 10.0 MV/cm, greater than or about 10.5 MV/cm, greater than or about 11.0 MV/cm, greater than or about 11.5 MV/cm, greater than or about 12.0 MV/cm, greater than or about 12.5 MV/cm, or higher. Consequently, the present technology may produce oxide films that may be reinforced as composite layers, as well as produce modified oxide layers, any of which may resist deformation and collapse during wet etch or other removal processes, and may substantially retain or be treated to improve electrical performance.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure, the method comprising:
    forming a first silicon oxide layer overlying a semiconductor substrate;
    forming a first silicon layer overlying the first silicon oxide layer;
    forming a silicon nitride layer overlying the first silicon layer;
    forming a second silicon layer overlying the silicon nitride layer;
    forming a second silicon oxide layer overlying the second silicon layer;
    removing the silicon nitride layer;
    removing the first silicon layer and the second silicon layer; and
    forming a metal layer between each of the first silicon oxide layer and the second silicon oxide layer.

2. The method of forming a semiconductor structure of claim 1, wherein the silicon nitride layer is removed by a wet etch process.

3. The method of forming a semiconductor structure of claim 1, wherein the first silicon layer and the second silicon layer are removed by a dry etch process.

4. The method of forming a semiconductor structure of claim 1, wherein the second silicon layer and the second silicon oxide layer form a composite film characterized by a Young's modulus of greater than or equal to 90 GPa.

5. The method of forming a semiconductor structure of claim 1, wherein the metal layer comprises tungsten.

6. The method of forming a semiconductor structure of claim 1, further comprising:
    forming a liner layer along the first silicon oxide layer and the second silicon oxide layer subsequent removing the first silicon layer and the second silicon layer.

7. The method of forming a semiconductor structure of claim 1, wherein forming the first silicon oxide layer occurs in a first processing chamber, wherein removing the first silicon layer and the second silicon layer occurs in a second processing chamber, the method further comprising:
    transferring the semiconductor substrate from the first processing chamber to the second processing chamber while maintaining vacuum conditions.

8. The method of forming a semiconductor structure of claim 1, wherein the first silicon oxide layer and the second silicon oxide layer are characterized by a thickness of less than or equal to 50 nm.

9. A method of forming a semiconductor structure, the method comprising:
    forming a first silicon oxide layer overlying a semiconductor substrate;
    forming a first amorphous silicon layer overlying the first silicon oxide layer;
    forming a silicon nitride layer overlying the first amorphous silicon layer;
    forming a second amorphous silicon layer overlying the silicon nitride layer;
    forming a second silicon oxide layer overlying the second amorphous silicon removing the silicon nitride layer;
    flowing a gaseous metal-containing precursor to contact the first amorphous silicon layer and the second amorphous silicon layer; and
    thermally activating a conversion reaction at greater 300 C to exchange silicon in the first amorphous silicon layer and the second amorphous silicon layer with a metal material from the gaseous metal-containing precursor to form a layer of transitional metal.

10. The method of forming a semiconductor structure of claim 9, wherein the exchange comprises:
forming a volatile silicon-containing byproduct while forming a layer of the transitional metal.

11. The method of forming a semiconductor structure of claim 9, further comprising:
forming a layer of metal material extending between the first silicon oxide layer and the second silicon oxide layer.

12. The method of forming a semiconductor structure of claim 9, wherein the silicon nitride layer is removed by a wet etch process.

13. The method of forming a semiconductor structure of claim 9, wherein the first amorphous silicon layer and the second amorphous silicon layer are characterized by a thickness of less than or equal to 5 nm.

14. A method of forming a semiconductor structure, the method comprising:
forming a first silicon oxide layer overlying a semiconductor substrate, wherein the first silicon oxide layer comprises a nitrogen dopant or a silicon-rich stoichiometry, and the first silicon oxide layer is characterized by a Young's modulus of greater than or equal to 110 GPa;
forming a silicon nitride layer overlying the first silicon oxide layer;
forming a second silicon oxide layer overlying the silicon nitride layer, wherein the second silicon oxide layer comprises a nitrogen dopant or a silicon-rich stoichiometry;
removing the silicon nitride layer; and
treating the first silicon oxide layer and the second silicon oxide layer.

15. The method of forming a semiconductor structure of claim 14, wherein the treating comprises performing a steam anneal.

16. The method of forming a semiconductor structure of claim 14, wherein the first silicon oxide layer comprises the nitrogen dopant incorporated to a nitrogen concentration below or equal to 5%.

17. The method of forming a semiconductor structure of claim 14, wherein the first silicon oxide layer is characterized by an oxygen to silicon stoichiometric ratio of less than or equal to 1.8:1.

18. The method of forming a semiconductor structure of claim 17, wherein the first silicon oxide layer is characterized by a Young's modulus of greater than or equal to 130 GPa.

19. The method of forming a semiconductor structure of claim 14, wherein, subsequent the treating, the first silicon oxide layer and the second silicon oxide layer are characterized by a breakdown voltage of greater than or equal to 9 MV/cm.

* * * * *